(12) United States Patent
Tanizawa

(10) Patent No.: US 11,665,875 B2
(45) Date of Patent: May 30, 2023

(54) SUBSTRATE WORK MACHINE

(71) Applicant: FUJI CORPORATION, Chiryu (JP)

(72) Inventor: Yoshiharu Tanizawa, Toyota (JP)

(73) Assignee: FUJI CORPORATION, Chiryu (JP)

( * ) Notice: Subject to any disclaimer, the term of this patent is extended or adjusted under 35 U.S.C. 154(b) by 601 days.

(21) Appl. No.: 16/641,028

(22) PCT Filed: Sep. 8, 2017

(86) PCT No.: PCT/JP2017/032500
§ 371 (c)(1),
(2) Date: Feb. 21, 2020

(87) PCT Pub. No.: WO2019/049318
PCT Pub. Date: Mar. 14, 2019

(65) Prior Publication Data
US 2020/0221617 A1 Jul. 9, 2020

(51) Int. Cl.
*H05K 13/00* (2006.01)
*H05K 13/08* (2006.01)
(Continued)

(52) U.S. Cl.
CPC ....... *H05K 13/0813* (2018.08); *G06T 7/0006* (2013.01); *G06T 7/62* (2017.01);
(Continued)

(58) Field of Classification Search
CPC ........... H05K 13/0409; H05K 13/0812; H05K 13/0813; H05K 13/083; G06T 7/0006; G06T 7/62; G06T 2207/30141
See application file for complete search history.

(56) References Cited

U.S. PATENT DOCUMENTS 10,879,100 B2 * 12/2020 Hayashi ................. B65G 43/08
2006/0120401 A1 * 6/2006 Harada ................ G06Q 10/087
370/465
(Continued)

FOREIGN PATENT DOCUMENTS

JP 2014-204058 A 10/2014

OTHER PUBLICATIONS

Extended European Search Report dated Jul. 20, 2020 in European Patent Application No. 17924228.4, 9 pages.
(Continued)

*Primary Examiner* — Paul D Kim
(74) *Attorney, Agent, or Firm* — Oblon, McClelland, Maier & Neustadt, L.L.P.

(57) ABSTRACT

A substrate work machine for repeatedly performing substrate work, the substrate work machine including a data storing section configured to store component data used in the substrate work, the component data including shape data related to a shape of an electronic component to be mounted on a substrate, a reference value and a tolerance; a data determining section configured to determine whether a difference between measurement data acquired by measuring the electronic component during the substrate work and the reference value of the component data is within a range of the tolerance; a quality information acquiring section configured to acquire work quality information related to a performance condition of a second substrate work machine; and a data correcting section configured to correct at least one of the reference value and the tolerance in accordance with the work quality information.

10 Claims, 5 Drawing Sheets

(51) Int. Cl.
  *G06T 7/62*   (2017.01)
  *H05K 13/04*  (2006.01)
  *G06T 7/00*   (2017.01)

(52) U.S. Cl.
  CPC ....... *H05K 13/0409* (2018.08); *H05K 13/083* (2018.08); *H05K 13/0812* (2018.08); *G06T 2207/30141* (2013.01)

(56) References Cited

U.S. PATENT DOCUMENTS

| | | |
|---|---|---|
| 2006/0271226 A1 | 11/2006 | Tasaki et al. |
| 2018/0153062 A1* | 5/2018 | Sakurayama ........ H05K 13/081 |
| 2020/0166916 A1* | 5/2020 | Tanizawa ......... G05B 19/41865 |

OTHER PUBLICATIONS

International Search Report dated Dec. 5, 2017 in PCT/JP2017/032500 filed Sep. 8, 2017, 1 page.

* cited by examiner

SUBSTRATE WORK MACHINE

TECHNICAL FIELD

The present specification relates to a substrate work machine for repeatedly performing work on a substrate.

BACKGROUND ART

Techniques for mass-producing a board on which electronic circuits are formed by repeatedly performing various operations (hereinafter, referred to as substrate work) for mounting an electronic component (hereinafter, also referred to as component) on a board on which printed wiring is formed have become widespread. A substrate work line for performing the substrate work is composed of multiple types of substrate work machines such as a component mounter for mounting components on a board and a board inspection machine for inspecting the mounting condition of the components. Many substrate work machines use component data that includes data on the shapes of components. A technical example related to control of such a substrate work machine is disclosed in patent literature 1.

The mounting control device of patent literature 1 includes a control parameter setting section for setting a control parameter used when mounting components to a component mounter, and a control parameter acquiring section for acquiring a control parameter based on evaluation values calculated from leading index evaluation functions determined according to the component and a carrier tape accommodating the component. According to descriptions of an embodiment, based on a trigger of an increase in the deviation amount of the mounting position when a specified quantity of mounting work is performed at the component mounter, the control parameters are automatically adjusted having calculated an evaluation value by calculating a deviation amount using statistical methods. Examples of a control parameter include the feeding speed of the carrier tape in a component feeder, the raising and lowering speed and the lowering height of a suction nozzle, and the like. According to this, it is possible to reduce the occurrence of various defects in which the component cannot be mounted, such as the component remaining on the nozzle during mounting, a pickup error, a dropped component, or the like.

CITATION LIST

Patent Literature

Patent literature 1: JP-A-2014-204058

BRIEF SUMMARY

Technical Problem

However, even if control parameters of a component mounter are appropriate, an error may still occur in a mounting operation. In this case, many times the cause of the work error is thought to be component data used by the component mounter. More specifically, the component data includes data relating to the shape of the component, and is set including a reference value and a tolerance. Here, to ensure high reliability, the tolerance is usually set to be strict. When this is done, if the manufacturer, the lot, or the like of the component to be mounted is changed, there may be an increase in the number of work errors. That is, since the shape, appearance, and the like of components vary slightly due to differences between manufacturers, lots, and the like, these may cause work errors.

In this case, the reason is that the component data does not match the actual state of the component. Therefore, by correcting the reference value and the tolerance of the component data in accordance with the actual state of the component, one can expect to reduce work errors. However, if the component data is corrected carelessly, the reliability of the component data may deteriorate and a defective board may be produced. Thus, it is necessary to ensure high reliability when correcting the component data. Conventionally, correction of component data has been performed carefully by a skilled operator, which leads to a decrease in production efficiency.

It should be noted that the above-mentioned problems are common to substrate work machines other than component mounters. For example, board inspection machines repeatedly perform an inspection operation using inspection component data including reference values and tolerances. When defective boards increase as a result of inspection work, the quantity of defective boards is expected to decrease by correcting the inspection component data. Also in this case, it is necessary to ensure high reliability when correcting the inspection component data.

An object of the present disclosure is to provide a substrate work machine capable of automatically correcting component data while ensuring high reliability when work errors or defective boards increase during substrate work, thereby reducing defects.

Solution to Problem

The present specification discloses a substrate work machine for repeatedly performing substrate work, the substrate work machine including: a data storing section configured to store component data used in the substrate work, the component data including shape data related to a shape of an electronic component to be mounted on a substrate, a reference value and a tolerance; a data determining section configured to determine whether a difference between measurement data acquired by measuring the electronic component during the substrate work and the reference value of the component data is within a range of the tolerance; a quality information acquiring section configured to, in a case in which the difference is not within the range of the tolerance, acquire work quality information related to a performance condition of a second substrate work machine that is a different type of machine arranged upstream or downstream of the substrate work machine; and a data correcting section configured to correct at least one of the reference value and the tolerance in accordance with the work quality information.

Advantageous Effects

According to the substrate work machine disclosed herein, when an error occurs in which the difference between the measurement data obtained by observing a component and a reference value of the component data is not within a tolerance, work quality information related to a performance condition of a second substrate work of a second substrate work machine on an upstream side or a downstream side is obtained, and at least one of the reference value or the tolerance is corrected in accordance with the work quality information. According to this configuration, since the component data is automatically corrected within a range in which high reliability can be ensured by considering the work quality information, it is possible to reduce errors and avoid making risky changes to the component data.

DESCRIPTION OF EMBODIMENTS

1. Structure of Component Mounter 1 (Substrate Work Machine of an Embodiment)

Figure 1:
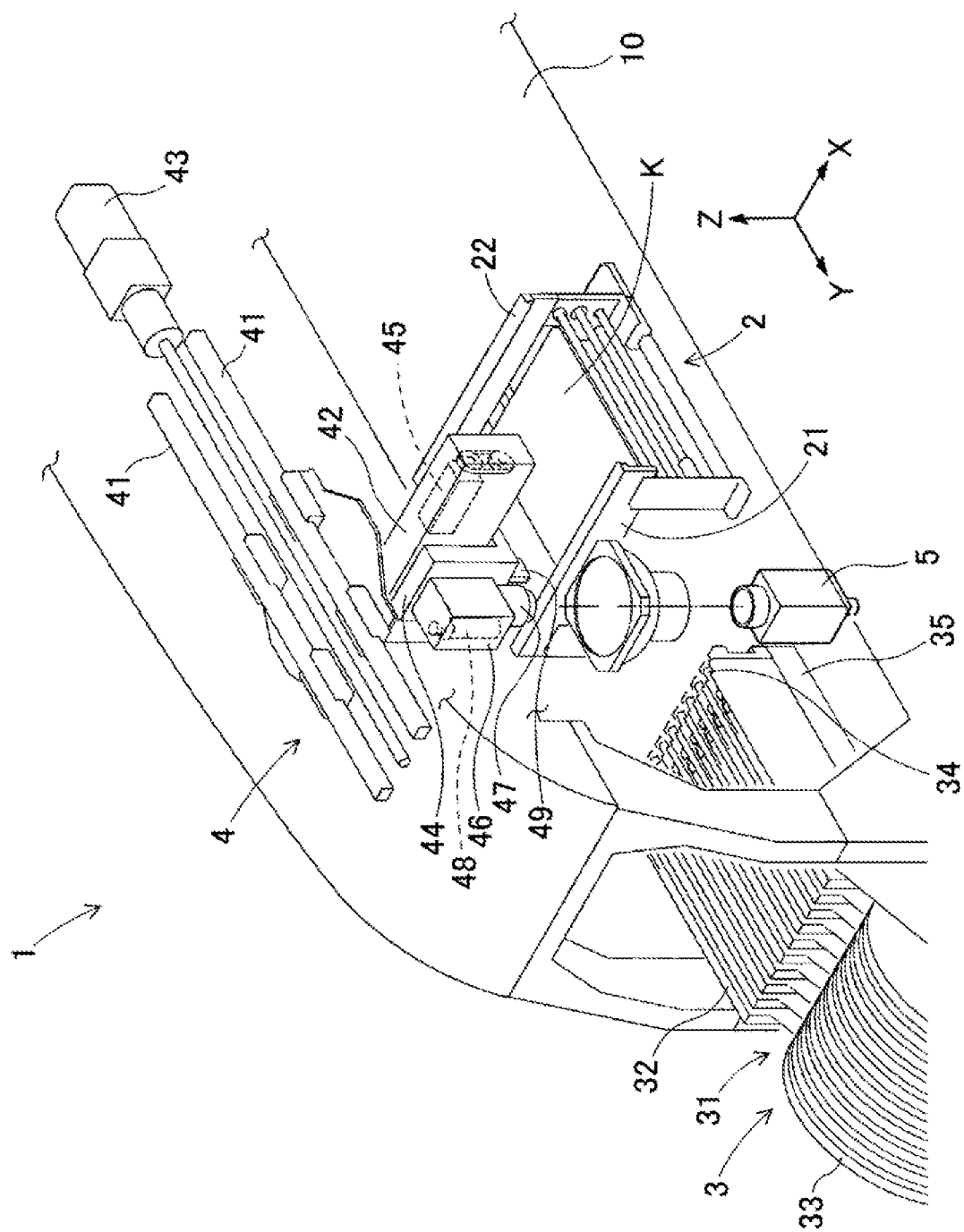
FIG. 1 is a perspective view of the configuration of main sections of a component mounter that is an example of a substrate work machine of an embodiment.

Component mounter 1, which is an example of a substrate work machine of an embodiment, will be described with reference to FIGS. 1 to 7. FIG. 1 is a perspective view of the configuration of main sections of component mounter 1 that is an example of a substrate work machine of an embodiment. The direction from the upper left to the lower right in FIG. 1 is the X-axis direction in which board K is conveyed, and the direction from the upper right to the lower left is the Y-axis direction which is the front-rear direction of component mounter 1. The component mounter 1 repeatedly performs component mounting work.

Component mounter 1 includes items such as board conveyance device 2, component supply device 3, component transfer device 4, component camera 5, control section 6 (refer to FIGS. 2 and 3), and machine base 10.

Board conveyance device 2 includes first guide rail 21 and second guide rail 22, a pair of conveyor belts, a clamp device, and the like. First guide rail 21 and second guide rail 22 are mounted on machine base 10 parallel to each other so as to extend in the X-direction across the upper center of machine base 10. A pair of conveyor belts arranged in parallel to each other are arranged directly below first guide rail 21 and second guide rail 22. The pair of conveyor belts revolve with board K in contact with the conveyance surface of the conveyor belts to load and unload board K to and from a mounting position set in a center section of machine base 10. Further, a clamp device is provided below the conveyor belts in the central portion of machine base 10. The clamp device pushes up board K with multiple pusher pins and clamps it horizontally to position it in the mounting position.

Component supply device 3 is detachably mounted on the front side of component mounter 1. Component supply device 3 is configured by arranging multiple feeder devices 31 on feeder pallet 35. Feeder device 31 includes: main body 32; supply reel 33 provided on the front side of main body 32; and component removal section 34 provided on an upper rear portion of main body 32. Carrier tape in which many components are sealed at a predetermined pitch is wound and held on supply reel 33. When the carrier tape is fed out at predetermined pitches, components are exposed from the encapsulated state and sequentially fed to component removal section 34.

Component transfer device 4 includes items such as pair of Y-axis rails 41, Y-axis moving table 42, Y-axis motor 43, X-axis moving table 44, X-axis motor 45, mounting head 46, rotary tool 47, Z-axis motor 48, and component side view camera 49. The pair of Y-axis rails 41 is provided above the region from the rear section of machine base 10 to component supply device 3 at the front. Y-axis moving table 42 is loaded on pair of Y-axis rails 41. Y-axis moving table 42 is moved in the Y-axis direction by the driving of Y-axis motor 43 via a ball screw mechanism. X-axis moving table 44 is loaded on Y-axis moving table 42. X-axis moving table 44 is moved in the X-axis direction by the driving of X-axis motor 45 via a ball screw mechanism.

Mounting head 46 is arranged on the front side of X-axis moving table 44. Mounting head 46 has rotary tool 47 on a lower side. Although omitted from FIG. 1, multiple suction nozzles are arranged in a ring on the lower side of rotary tool 47. By rotating rotary tool 47, one of the multiple suction nozzles is selected and set to the operating position. The suction nozzle set to the operating position is driven by Z-axis motor 48 to move up and down. The suction nozzle picks up the component from component removal section 34 by supplying negative pressure, and mounts the component on board K by supplying positive pressure. A clamping type component mounting tool that clamps a component may be used as a component mounting tool instead of the suction nozzle.

Component side view camera 49 is arranged below X-axis moving table 44. Component side view camera 49 captures an image from the side of components held by the multiple suction nozzles of mounting head 46. The acquired image data is subjected to image processing, and the pickup state, thickness dimension, and the like of the component are confirmed. Component side view camera 49 corresponds to a captured image processing section configured to acquire measurement data by performing image processing using component data 65 (to be described later) on image data obtained by imaging a component. Note that, component camera 5, described later, may be used as a captured image processing section without using component side view camera 49.

Component transfer device 4 proceeds with mounting operations by repeating the pickup and mounting cycle. In detail, mounting head 46 of component transfer device 4 moves to component supply device 3 and picks up components with multiple suction nozzles. Next, upon mounting head 46 moving to component camera 5, the pickup states of the multiple components are imaged. Then, mounting head 46 moves to board K to mount the multiple components, and returns to component supply device 3 when the mounting is completed.

Component camera 5 is provided facing upwards on an upper surface of machine base 10 between board conveyance device 2 and component supply device 3. Component camera 5 captures an image of a state in which the multiple suction nozzles of mounting head 46 are moving to board K having picked up components from component removal section 34. As a result, component camera 5 can collectively image the components held by the multiple suction nozzles. The acquired image data is subjected to image processing to confirm the pickup condition of the component, the vertical and horizontal dimensions of the component, the arrangement of the connecting electrodes, and so on. Component camera 5, similar to component side view camera 49, corresponds to a captured image processing section.

Control section 6 stores job data for each type of board, and controls mounting operation. The job data is data describing a detailed procedure and method for mounting operation. Control section 6 transmits various commands to board conveyance device 2, component supply device 3, component transfer device 4, and component camera 5. Control section 6 also receives information on the operation status from these devices. For example, control section 6 receives information on the supply state of components in component supply device 3, and recognizes changes in the manufacturer, lot, and the like of the components. Control section 6 may be configured as a single computer device or may be configured to be functionally distributed among multiple computer devices. Further, control section 6 may be configured by a hierarchical configuration of multiple computer devices.

2. Overall Configuration of Substrate Work Line 9

Figure 2:
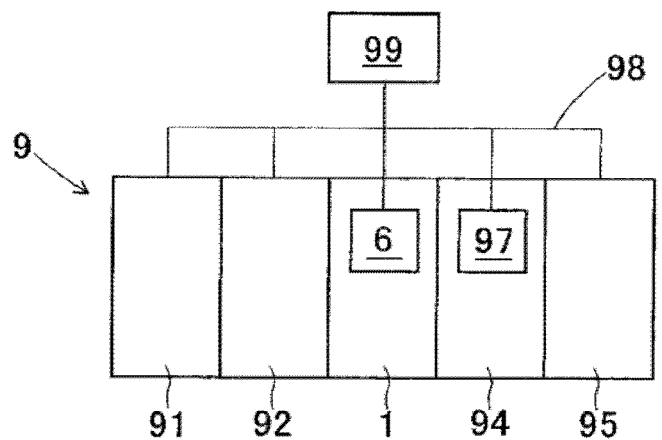
FIG. 2 schematically shows the entire configuration of a substrate work line including the component mounter.

FIG. 2 schematically shows the entire configuration of substrate work line 9 including component mounter 1. The illustrated substrate work line 9 is composed of five substrate work machines. Specifically, substrate work line 9 is configured by arranging solder printer 91, solder inspection machine 92, component mounter 1, board inspection machine 94, and reflow oven 95 in a row.

Solder printer 91 repeatedly performs a printing operation of printing solder paste on predetermined positions of board K. Solder printer 91 is configured from items such as a board conveyance device, a stencil with a circuit pattern cut into it that is loaded on board K, a squeegee which moves over the stencil to apply solder, and the like. Solder inspection machine 92 repeatedly performs a solder inspection operation for determining whether the printed condition of the solder on the board K is good. Solder inspection machine 92 includes, for example, a board conveyance device, an imaging camera for capturing an image of the printed solder to acquire image data, and an image determining section for image processing the image data to determine whether the condition of the printed solder is acceptable.

Board inspection machine 94 repeatedly performs an inspection operation for inspecting the mounting condition of components mounted on board K. Board inspection machine 94 includes a board conveyance device, an inspection camera for imaging a component mounted on board K, inspection control section 97, and the like. Reflow oven 95 repeatedly performs a reflow operation of heating and melting the solder paste and then cooling the solder paste. As a result, board K is produced by finishing mounting operation and forming reliable solder joints. Reflow oven 95 includes, for example, a board conveyance device, a heater, a cooling device, a temperature adjustment device, and the like.

The configuration of substrate work line 9 described above may be changed, and the configuration of each substrate work machine may also be changed. Host computer 99 is provided to manage the overall operation of substrate work line 9. Host computer 99 is connected to solder printer 91, solder inspection machine 92, component mounter 1, board inspection machine 94, and reflow oven 95 via communication line 98, and performs data communication individually. Bi-directional data transfer between control section 6 of component mounter 1 and inspection control section 97 of board inspection machine 94 is enabled via host computer 99.

3. Configuration of Control Items of Component Mounter 1

Figure 3:
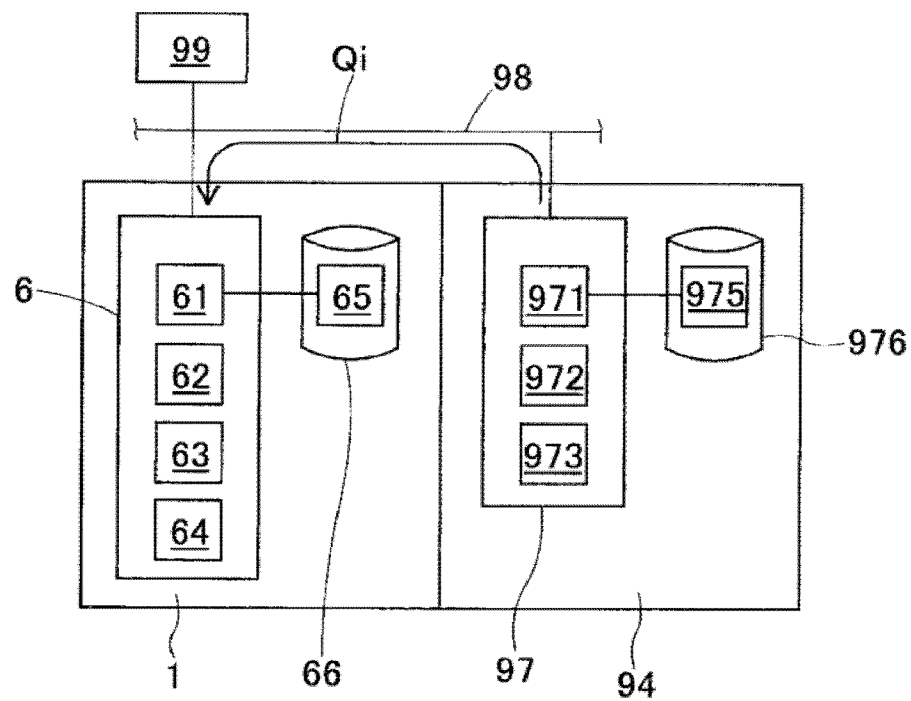
FIG. 3 is a block diagram showing a configuration of control items of the component mounter and a configuration of control items of a board inspection machine.

Next, the control configuration of control items of component mounter 1 will be described. FIG. 3 is a block diagram showing a configuration of control items of component mounter 1 and a configuration of control items of board inspection machine 94. Control section 6 of component mounter 1 includes data storing section 61, data determining section 62, quality information acquiring section 63, and data correcting section 64. Inspection control section 97 of board inspection machine 94 includes data storing section 971, inspection determining section 972, and quality information collecting section 973.

Data storing section 61 stores component data 65 of the components to be mounted on board K in memory 66. Component data 65 includes shape data related to the shapes of components. Shape data includes items such as the appearance color of the main body and connecting electrodes of the component, the vertical dimension, the horizontal dimension, and the thickness dimension of the component, and the arrangement data of the connecting electrodes. The arrangement data of the connecting electrodes includes items such as the shapes and sizes of the leads and the bumps, and the relative positional relationships between the leads and the bumps and the component center. The appearance color data is used for detecting the main body of a component and the configuration of connecting electrodes when image processing the image data acquired by component side view camera 49 and component camera 5. The shape data other than the appearance color is used for determining a defect such as an error in the type of a component or a deformation of a component.

Further, component data 65 includes orientation data representing the positional relationship of the component held by the suction nozzle. The orientation data includes items such as a shift amount, a rotational amount, and an angle of the component with respect to the suction nozzle. The orientation data is used for determining whether the pickup state of the component is good.

The shape data and the orientation data of component data 65 are set to include a reference value and a tolerance. The reference value and the tolerance may be automatically corrected by data correcting section 64. As an initial value of the reference value of component data 65, for example, a standard value, an ideal value, a true value, or the like specified in a standard, specification, or the like is set. Further, the tolerance of component data 65 is set strictly in order to ensure high reliability. That is, as the initial value of the tolerance, a range narrower than the specified maximum tolerance is set.

Data determining section 62 determines whether the difference between the measurement data obtained by observing the component during mounting operation and the reference value of component data 65 falls within the tolerance. The measurement data includes actual shape measurement data relating to the shape of the component and actual orientation measurement data relating to the positional relationship of the held component. The shape measurement data and the orientation measurement data are obtained by image processing the image data acquired by component side view camera 49 and component camera 5. If the difference does not fall within the tolerance, data determining section 62 determines that the component has a defective shape or a defective pickup state. The component determined to be defective is not mounted on board K, and is discarded.

Quality information acquiring section 63 operates when data determining section 62 determines that there is a defect. Quality information acquiring section 63 acquires work quality information Qi (described later) of the inspection work of board inspection machine 94 via host computer 99. Board inspection machine 94 corresponds to second substrate work machine, which is a different type of machine arranged downstream of component mounter 1, and inspection work corresponds to second substrate work.

Data correcting section 64 corrects at least one of the reference value and the tolerance of component data 65 in accordance with work quality information Qi of the inspection work. When work quality information Qi indicates a good performance state of the inspection work, data correcting section 64 widens the tolerance or shifts the reference value. It is desirable that data correcting section 64 analyzes the state in which data determining section 62 determined that there was a defect, and determines an appropriate correction method in consideration of the degree of the quality of work quality information Qi.

Note that, the work quality information Qi indicates a performance state in which the inspection work is not satisfactory, data correcting section 64 performs correction for narrowing the tolerance, but it is not essential to perform correction. Further, when the type of the board K being produced in substrate work line 9 is changed, data correcting section 64 returns the reference value and the tolerance of component data 65 to the default values.

On the other hand, data storing section 971 of inspection control section 97 of board inspection machine 94 stores inspection-use component data 975 used for inspection in memory 976. Inspection-use component data 975 includes shape data related to the shape of the component and position data related to the mounting position of the component on board K. The shape data items of inspection-use component data 975 may be different from those of component data 65 of component mounter 1. For example, since the items of external appearance and arrangement data of connecting electrodes are not used for the inspection, these do not have to be included in inspection-use component data 975. Position data of inspection-use component data 975 includes items such as an X-axis coordinate value and a Y-axis coordinate value of the specified mounting position, and a rotational angle of the component.

Inspection-use component data 975 is used as a criterion of acceptability during inspection work. The shape data and the position data of inspection-use component data 975 are also set including reference values and a tolerance. The reference values and tolerance of inspection-use component data 975 may be different from those of component data 65 of component mounter 1. For example, the tolerance of the vertical dimension and the horizontal dimension of the component in inspection-use component data 975 is narrower than that of component data 65 of component mounter 1 in many cases.

Inspection determining section 972 performs image processing on the image data acquired by the inspection camera to obtain measurement data of the shape and mounting position of the component. Further, inspection determining section 972 compares this measurement data with inspection-use component data 975 to determine whether the shape and the mounting position of the component are acceptable. Inspection determining section 972 determines whether each board K passes or fails inspection. Quality information collecting section 973 collects the determination results of inspection determining section 972 to obtain work quality information Qi of the inspection work. Work quality information Qi includes at least one of shape error information, position error information, and statistical processing information.

Shape error information represents an error between the measurement data of the shape of the component and the reference value of the shape data of inspection-use component data 975. Position error information represents an error between the measurement data of the mounting position of the component and the reference value of the position data of inspection-use component data 975. The statistical processing information is information obtained by statistically processing at least one of multiple pieces of shape error information and multiple pieces of position error information. Examples of the statistical processing information include a process capability index CPK, an average value of errors, a positive maximum error among errors, and a negative maximum error among errors.

The process capability index CPK is an index representing the rate of occurrence of defects in the inspection work. For example, suppose that the variation of the measurement data of a certain inspection item of board K follows a normal distribution. In this case, when the range of six times the standard deviation of the normal distribution coincides with the range of the tolerance of inspection-use component data 975, the process capability index CPK is 1. In other words, the process capability index CPK=1 means that the occurrence frequency of defects is 0.27%. If the process capability index CPK is larger than 1, the occurrence frequency of defects is lower than 0.27%. If the process capability index CPK is smaller than 1, the occurrence frequency of defects is higher than 0.27%.

4. Operation and Effects of Component Mounter 1

Figure 4:
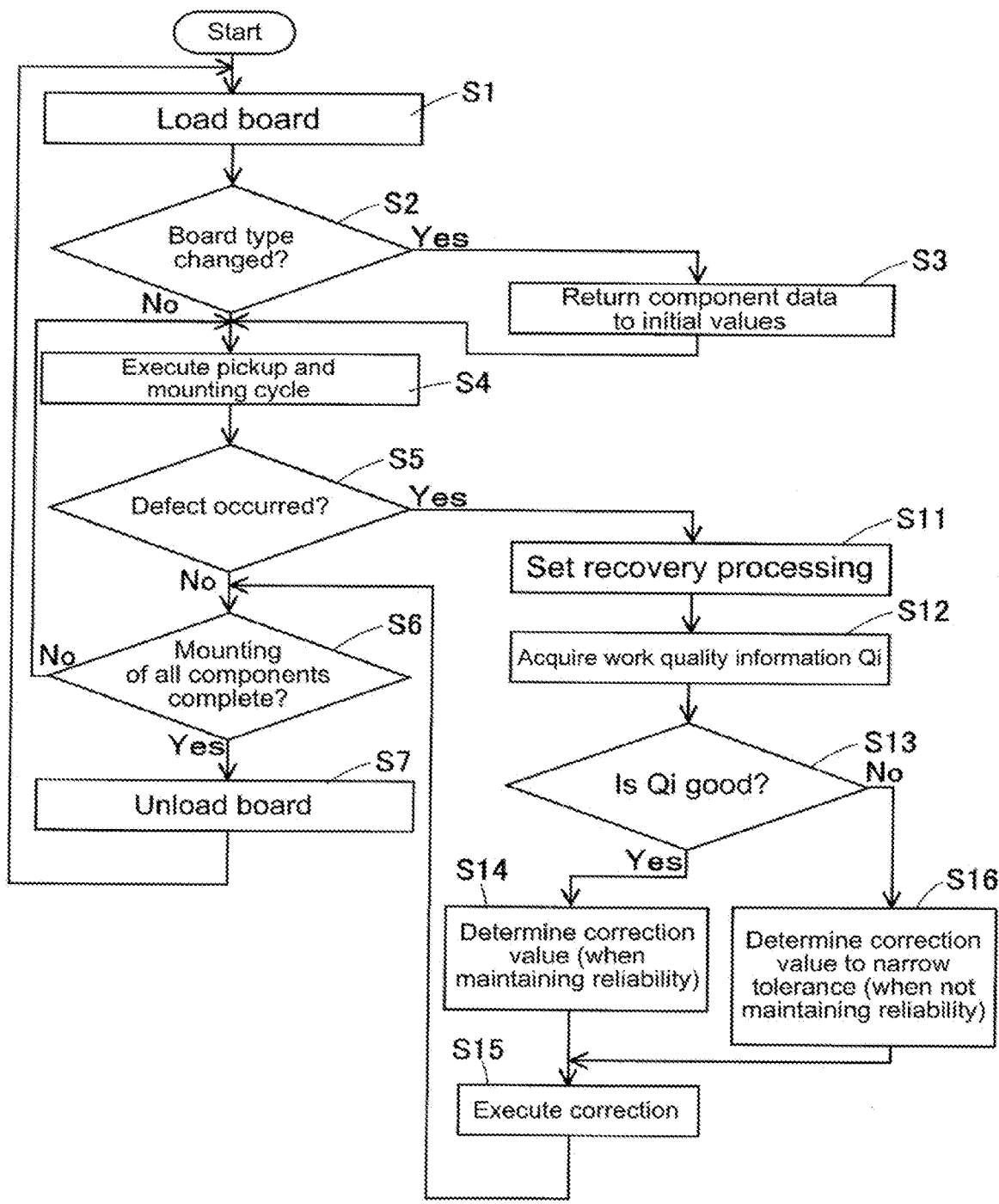
FIG. 4 is a flow chart of an operation flow of a control section for illustrating an operation of the component mounter.

Next, the operation and effects of component mounter 1 will be described using an example situation in which a defect occurs. FIG. 4 is a flow chart of an operation flow of control section 6 for illustrating an operation of component mounter 1. In step S1 of FIG. 4, control section 6 loads board K that is the target for mounting work. In step S2, data correcting section 64 of control section 6 determines whether the type of the board K has been changed, and if it has been changed, data correcting section 64 proceeds to the step S3 to execute the next step in the operation flow. In step S3, data correcting section 64 returns reference value R3 (to be described later) and tolerance V2 (to be described later) of component data 65 to initial reference value R1 (to be described later) and tolerance V1 (to be described later).

If the type of board K has not changed in step S2, and after the execution of step S3, control section 6 advances the operation flow to step S4, and executes the pickup and mounting cycle. In step S5, data determining section 62 determines whether a defective component shape or defective pickup orientation has occurred during the pickup and mounting cycle. In many cases, no defects occur, and data determining section 62 proceeds to step S6 to execute the next step in the operation flow.

In step S6, control section 6 determines whether the mounting of all predetermined components has been completed. If there remains an unmounted component, control section 6 returns the operation flow to step S4, and repeats the loop of step S4, step S5, and step S6. When the mounting of all the components is completed, control section 6 advances the operation flow from step S6 to step S7. In step S7, control section 6 unloads the board K on which all the components have been mounted. Then, control section 6 returns the operation flow to step S1, and proceeds to mounting operation of the next board K.

Figure 5:
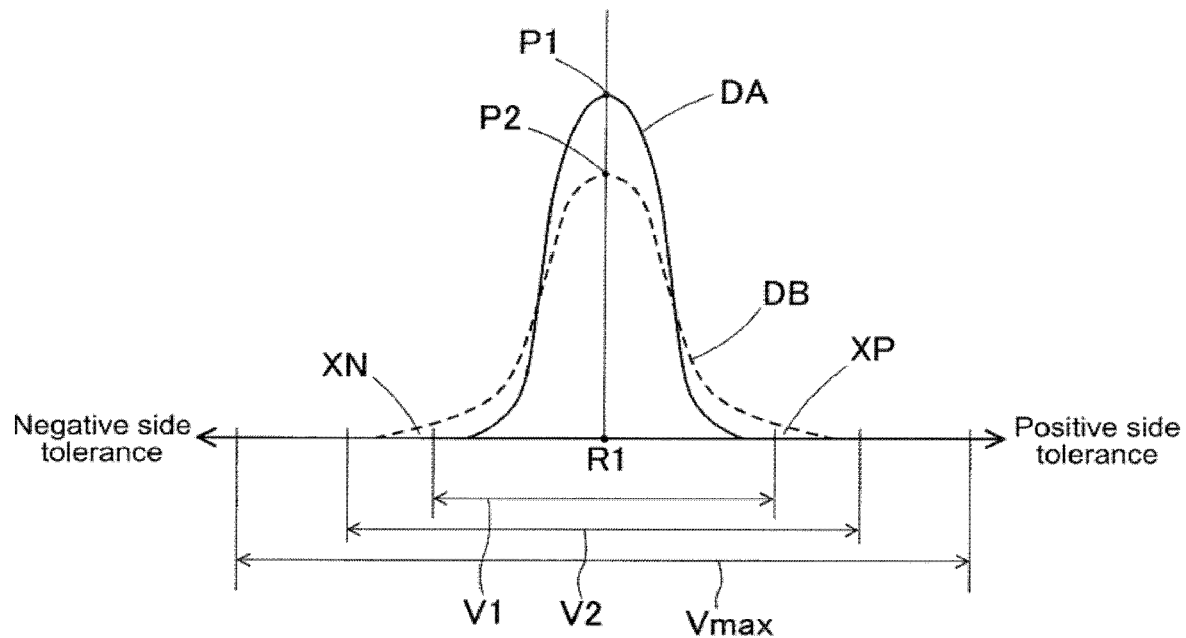
FIG. 5 illustrates a state of an occurrence of an error during a pickup and mounting cycle of the component mounter.

If a defect occurs in step S5, data determining section 62 branches the execution of the operation flow to step S11. FIG. 5 illustrates a state of an occurrence of an error during a pickup and mounting cycle of component mounter 1. FIG.

5 shows a distribution DA and a distribution DB representing a variation state of one item of measured data in the pickup and mounting cycle. Further, FIG. 5 shows initial reference value R1 and initial tolerance V1 of component data 65. The range of tolerance V1 is set so as to have equal widths on the positive side and the negative side of the reference value R1, and is narrower than the maximum tolerance Vmax specified in standards, specifications, or the like.

Here, control section 6 of component mounter 1 accumulates the measurement data during mounting work and statistically analyzes the data. To describe a specific example, the components of manufacturer A were initially supplied from a certain feeder device 31 of component supply device 3. The measured data at that time had a variation in the distribution DA shown by the solid line in FIG. 5. In the distribution DA, peak P1 of the measurement data overlaps reference value R1, and the entire quantity of the measurement data falls within the range of tolerance V1. Therefore, no defect occurred while components of manufacturer A were supplied.

However, the components of manufacturer A run out, and components of manufacturer B are replenished and supplied. Subsequent measurement data showed the variation of the distribution DB shown by the broken line in FIG. 5. In the distribution DB, similar to distribution DA, peak P2 of the measurement data overlaps with reference value R1. However, due to the large variation in the component quality of manufacturer B, the variation in the measurement data in distribution DB is wider than the distribution DA. As a result, as indicated by XP or XN in FIG. 5, measurement data deviating from tolerance V1 occurred and a defect occurred.

In step S11, when a defect has occurred, control section 6 sets recovery processing for a component that has been determined to be defective and cannot be mounted this time. For example, control section 6 changes settings such that the component that could not be mounted this time is mounted in a subsequent pickup and mounting step. Alternatively, control section 6 may add pickup and mounting steps for mounting components that could not be mounted this time. In step S12, quality information acquiring section 63 acquires work quality information Qi of the inspection work of board inspection machine 94.

Figure 6:
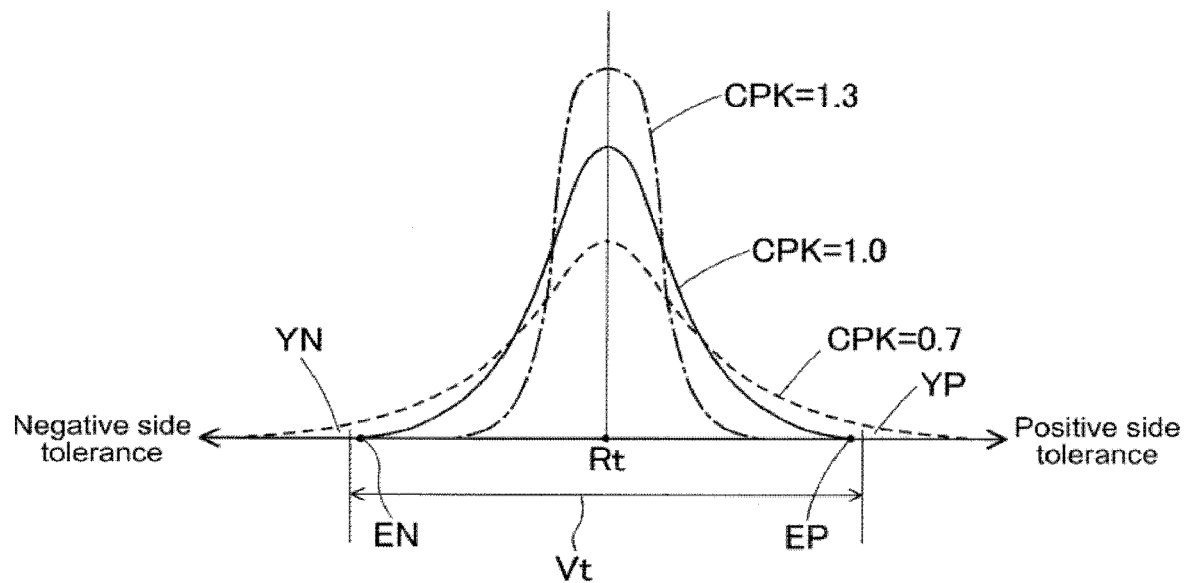
FIG. 6 shows an example of work quality information of the board inspection machine.

FIG. 6 shows an example of work quality information Qi of board inspection machine 94. FIG. 6 shows a state of the distribution of the measurement data of a certain inspection item of the inspection work. FIG. 6 also shows reference value Rt and tolerance Vt of inspection-use component data 975. The range of the tolerance Vt is set to have equal widths on the positive side and the negative side of the reference value Rt.

In the present embodiment, the process capability index CPK of the inspection items related to defects generated in component mounter 1 is used as work quality information Qi. The process capability index CPK=1.0 is defined as a boundary for distinguishing whether the performance state of the inspection work is good. The distribution of the measurement data when the process capability index CPK=1.0 is shown by a solid line in FIG. 6. Without being limited thereto, the process capability index CPK may be set to a value other than CPK=1.0, and the process capability index CPK related to the determination of the pass or fail of board K may be used.

The distribution of the measurement data in a case of process capability index CPK=1.3, which indicates that the performance state of the inspection work is good, is shown by the single-dash broken line in FIG. 6. In this case, the distribution of the measurement data lies mostly away from the boundary line of the tolerance Vt range, and is densely clustered close to the reference value Rt. That is, the work quality of the inspection work is good, there is a large margin, and high reliability is ensured. On the other hand, the distribution of the measurement data in a case of process capability index CPK=0.7, which indicates that the performance state of the inspection work is not good, is shown by the broken line in FIG. 6. In this case, the distribution of the measurement data deviates from the range of tolerance Vt, and defects as indicated by YP and YN occur. That is, the work quality of the inspection work is not good. As a result, a failed board K occurs.

Returning to the operation flow of FIG. 4, in step S13, data correcting section 64 determines whether work quality information Qi is good. In step S14 in the case where the work quality information Qi is good, data correcting section 64 widens tolerance V1 or determines a correction value for shifting reference value R1. Here, work quality information Qi is good, and high reliability is ensured. Therefore, even if correction is performed, the work quality of the inspection work is satisfactorily maintained within the range and with a suitable margin. Therefore, it is desirable that data correcting section 64 determines the change width of the correction value in accordance with the extent of the goodness of work quality information Qi. Further, data correcting section 64 can determine the correction value with reference to the distribution DB at the time of occurrence of a defect obtained by statistical analysis.

For example, a significant correction is possible when the process capability index CPK=1.3. However, in the case of process capability index CPK=1.1, which can be considered good, the change width of the correction value is limited to be small. Further, for example, the distribution DB at the time of occurrence of the defect represents the actual state of the components of the B manufacturer, and indicates that the cause of the defect is a large variation. Therefore, data correcting section 64 can determine correction for maintaining reference value R1 and widening tolerance V1 to tolerance V2.

Figure 7:
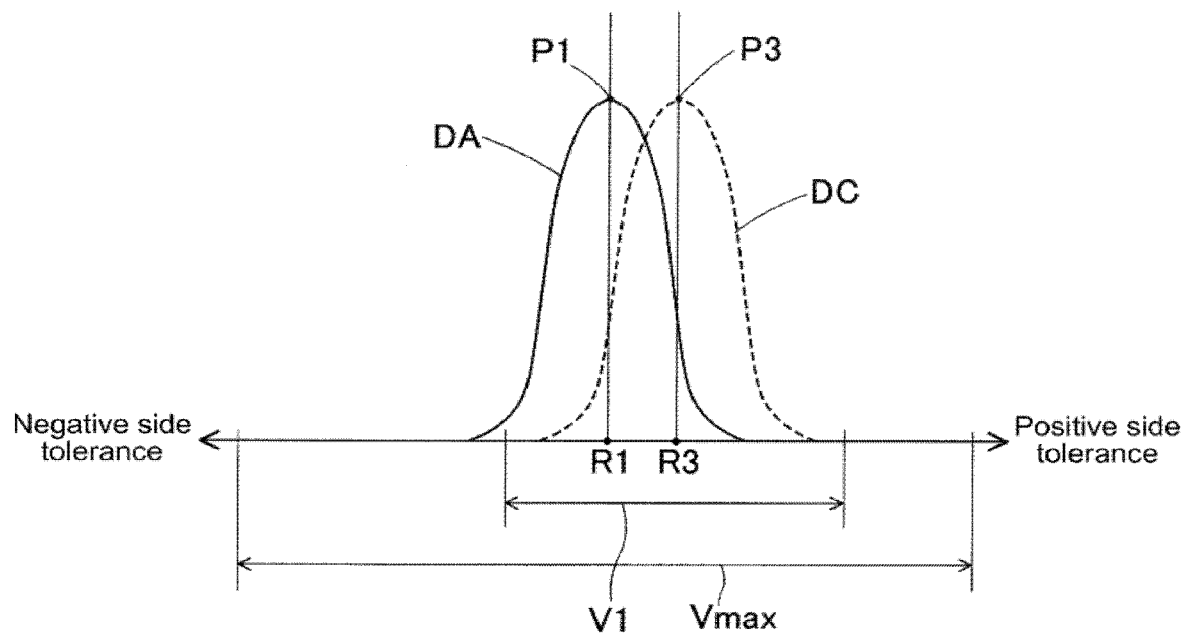
FIG. 7 illustrates a state of an occurrence of a different error during a pickup and mounting cycle of the component mounter.

The case of the distribution DC at the time of occurrence of a defect shown in FIG. 7 will also be described. FIG. 7 illustrates a state of an occurrence of a different error during a pickup and mounting cycle of component mounter 1. The distribution DA of the components of manufacturer A shown by the solid line in FIG. 5 is shown again in FIG. 7. In contrast, in the distribution DC of components of the C manufacturer indicated by the broken line, peak P3 is shifted to the positive side from reference value R1 due to unevenness in component quality. The extent of variation of distribution DC is equivalent to that of distribution DA. That is, the shape of distribution DC is obtained by shifting the distribution DA to the positive side. In this case too, data correcting section 64 performs correction in accordance with the actual state of the components of the C manufacturer. That is, data correcting section 64 shifts reference value R1 to the positive side to set reference value R3 corresponding to peak P3, and shifts the reference value R1 to the positive side while maintaining the range width of tolerance V1.

Note that, the cause of the defect in the examples of distribution DB and distribution DC is not limited to a change in the manufacturer of the component. In other words, a change in the lot of components or other attributes of the components, such as a difference in the production timing or a change in the component holding member, may cause a defect. In addition, data correcting section 64 may simultaneously correct both reference value R1 and tolerance V1. However, whatever corrections are made for whatever defects, both ends of the tolerances (V1, V2) need to be within a range that does not deviate from maximum tolerance Vmax.

In the step S15, data correcting section 64 executes correction by rewriting at least one of reference value R1 and tolerance V1 of component data 65 in memory 66, and merges the operation flow into step S6. By correcting component data 65, the occurrence of defects is reduced even for components of the B manufacturer or the C manufacturer, and there is a reduction in discarded components. In addition, the work efficiency of mounting operation is not reduced.

On the other hand, if work quality information Qi is not good in step S13, data correcting section 64 advances the operation flow to step S16. Here, since work quality information Qi is not good, there is no margin in the determination of the inspection work, and high reliability is not ensured. Therefore, if data correcting section 64 carelessly corrects the component data 65, this may lead to frequent occurrences of failed boards K. Thus, data correcting section 64 only allows the tolerance V1 to be narrowed, and determines a correction value obtained by narrowing the tolerance V1. Thereafter, data correcting section 64 merges the execution of the operation flow with step S15.

As described above, when operation quality data Qi of board inspection machine 94 is not good, the tolerance V1 of component data 65 is narrowed in the component mounter 1 in which the defect occurred. This may increase the discarding of components in component mounter 1, but decrease the quantity of failed boards K in board inspection machine 94.

Note that, if the correction value is insufficient or excessive, the branch from step S5 to step S11 may occur multiple times. In this case, step S14 is executed multiple times, and the correction value of component data 65 is gradually optimized. Alternatively, the correction for widening the tolerance V1 is performed in step S14 and the correction for narrowing the tolerance V1 is performed in step S16, with the correction for tolerance V1 converging so as to be optimized.

According to component mounter 1, when a defect occurs in which the difference between the measurement data obtained by observing the component and reference value R1 of component data 65 does not fall within tolerance V1, work quality information Qi related to the performance state of the inspection work of the downstream side board inspection machine 94 is obtained, and at least one of the reference value R1 and the tolerance V1 is corrected in accordance with the work quality information Qi. Accordingly, since component data 65 is not corrected carelessly, and component data 65 is automatically corrected within a range in which high reliability can be ensured in consideration of the work quality information Qi, it is possible to reduce defects.

Especially, the above effect becomes remarkable with respect to the variation and unevenness of the component quality when the manufacturer, lot, or the like of the component is changed. In addition, since the correction of component data 65, which has been conventionally performed by the operator, is performed automatically, labor saving is realized. In addition, since mounting operation is continued, production efficiency is not lowered.

5. Applications and Alternative Embodiments

Note that, instead of the process capability index CPK described in an embodiment above, statistical information such as the average value of the error, the positive side maximum error EP, the negative side maximum error EN (see FIG. 6), or the like may be used as work quality information Qi. Since this statistical information has a causal relationship with the work quality of the inspection work, this statistical information is appropriate as work quality information Qi. In addition, step S16 in a case in which work quality information Qi is not good in step S13 may be omitted. That is, the operation flow may be such that when work quality information Qi is good, steps S14 and S15 are executed and the operation flow merges in step S6, and when work quality information Qi is not good, the operation flow proceeds directly from step S13 to step S6.

Further, board inspection machine 94 may be a substrate work machine according to an embodiment, and component mounter 1 may be a different type of second substrate work machine on the upstream side. In this embodiment, when the difference between the measurement data acquired in the inspection operation of board inspection machine 94 and reference value Rt of inspection-use component data 975 is not within tolerance Vt, inspection control section 97 acquires the work quality data related to the performance state of mounting operation of component mounter 1. Specifically, the work quality information is information related to the occurrence of a shape defect or a pickup orientation defect of a component during the pickup and mounting cycle. Inspection control section 97 corrects at least one of reference value Rt and tolerance Vt of inspection-use component data 975 in accordance with the execution state of mounting operation. In other words, when ensuring high reliability of mounting operation, the inspection criterion can be adjusted to the actual state of the component by automatically correcting inspection-use component data 975, and the quantity of failed boards K can be reduced. Various other applications and modifications are possible for the embodiments.

REFERENCE SIGNS LIST

1: component mounter;
2: board conveyance device;
3: component supply device;
4: component transfer device;
49: component side view camera;
5: component camera
6: control section;
61: data storing section;
62: data determining section;
63: quality information acquiring section;
64: data correcting section;
65: component data;
9: substrate work line;
94: board inspection machine;
97: inspection control section;
971: data storing section;
972: inspection determining section;
973: quality information collecting section;
975: inspection-use component data;
K: substrate;
Qi: work quality information;
DA, DB, DC: distribution;
R1, R3: reference value;
V1, V2: tolerance;
Rt: reference value;
Vt: tolerance;
CPK: Process Capability Index;
EP: positive maximum error;
EN: negative maximum error

The invention claimed is:

1. A substrate work machine for repeatedly performing substrate work, the substrate work machine comprising:
    a data storing section configured to store component data used in the substrate work, the component data including shape data related to a shape of an electronic component to be mounted on a substrate, a reference value related to a dimension of the electronic component, and a tolerance against to measure a difference between a measured value and the reference value;
    a data determining section configured to determine whether the difference between the measured value acquired by measuring dimensions of the electronic component during the substrate work and the reference value of the component data is within a range of the tolerance;
    a quality information acquiring section configured to, in a case in which the difference is not within the range of the tolerance, acquire work quality information related to a performance condition of a second substrate work machine arranged upstream or downstream of the substrate work machine; and
    a data correcting section configured to correct at least one of the reference value and the tolerance in accordance with the work quality information.

2. The substrate work machine according to claim 1, wherein
    the data correcting section is configured to widen the tolerance or shift the reference value when the work quality information of the second substrate work machine is greater than a predetermined value.

3. The substrate work machine according to claim 1, wherein
    the data correcting section is configured to return the reference value and tolerance to default values when a type of the substrate is changed.

4. The substrate work machine according to claim 1, wherein
    the data determining section includes a captured image processing section configured to acquire the measured value by performing image processing using the component data on image data obtained by imaging the electronic component.

5. The substrate work machine according to claim 1, wherein
    the shape data includes at least one item of a vertical dimension or a horizontal dimension of the electronic component, a thickness dimension of the electronic component, an external color of the electronic component, or arrangement data of connecting electrodes of the electronic component.

6. The substrate work machine according to claim 1, wherein
    the substrate work machine is a component mounter configured to perform mounting work of collecting the electronic component from a component supply device using a component mounting tool and mounting the electronic component to a mounting position of the substrate as the substrate work, and
    the second substrate work machine is a board inspection machine arranged downstream of the component mounter and configured to perform inspection work of checking a mounting condition of the electronic component mounted on the substrate as the second substrate work machine.

7. The substrate work machine according to claim 6, wherein
    the component data includes orientation data representing a positional relationship of the electronic component collected from the component supply device with respect to the component mounting tool, and the measured value is part of measurement data that includes shape actual measurement data related to the shape of the electronic component and orientation actual measurement data relating to the positional relationship of the electronic component collected from the component supply device.

8. The substrate work machine according to claim 6, wherein
    the work quality information includes at least one of shape error information related to an error of the shape of the electronic component mounted on the substrate, position error information related to an error of the mounting position of the electronic component mounted on the substrate, and statistical process information obtained by statistically processing at least one of the shape error information and the position error information.

9. The substrate work machine according to claim 8, wherein
    the work quality information includes the statistical process information configured from at least one of a process capability index representing a rate of errors during the inspection work, a mean value of the errors, a positive maximum error of the errors, and a negative maximum error of the errors.

10. The substrate work machine according to claim 1, wherein
    the second substrate work machine is a component mounter configured to perform mounting work of collecting the electronic component from a component supply device using a component mounting tool and mounting the electronic component to a predetermined mounting position of the substrate as the substrate work, and
    the substrate work machine is a board inspection machine arranged downstream of the component mounter and configured to perform inspection work of checking a mounting condition of the electronic component mounted on the substrate as the second substrate work machine.

* * * * *